(12) United States Patent
Kim et al.

(10) Patent No.: US 11,196,000 B2
(45) Date of Patent: Dec. 7, 2021

(54) LOW FORMING VOLTAGE NON-VOLATILE MEMORY (NVM)

(71) Applicant: International Business Machines Corporation, Armonk, NY (US)

(72) Inventors: Youngseok Kim, Upper Saddle River, NJ (US); Injo Ok, Loudonville, NY (US); Alexander Reznicek, Troy, NY (US); Soon-Cheon Seo, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 103 days.

(21) Appl. No.: 16/671,901

(22) Filed: Nov. 1, 2019

(65) Prior Publication Data
US 2021/0135107 A1  May 6, 2021

(51) Int. Cl.
*H01L 47/00* (2006.01)
*H01L 45/00* (2006.01)

(52) U.S. Cl.
CPC .......... *H01L 45/1641* (2013.01); *H01L 45/08* (2013.01); *H01L 45/1233* (2013.01); *H01L 45/1253* (2013.01); *H01L 45/1675* (2013.01)

(58) Field of Classification Search
CPC . H01L 45/1641; H01L 45/08; H01L 45/1675; H01L 45/1233; H01L 45/1253
See application file for complete search history.

(56) References Cited

U.S. PATENT DOCUMENTS 9,012,260 B2   4/2015   Barabash et al.
9,466,794 B2   10/2016  Yang et al.
(Continued)

FOREIGN PATENT DOCUMENTS

CN   108565337 A   9/2018
WO   2013016283 A1  1/2013
(Continued)

OTHER PUBLICATIONS

Zhang, X., et al., "Forming-free performance of a-SiNx:H-based resistive switching memory obtained by oxygen plasma treatment", Nanotechnology, Published Apr. 13, 2018, 8 pages, 29, 245701.
(Continued)

*Primary Examiner* — Ismail A Muse
(74) *Attorney, Agent, or Firm* — Scully, Scott, Murphy & Presser, P.C.; L. Jeffrey Kelly, Esq.

(57) ABSTRACT

A low forming voltage NVM device is provided by forming a pair of sacrificial conductive pads on an interconnect dielectric material layer that embeds a pair of second electrically conductive structures and a patterned material stack. One of the sacrificial conductive pads has a first area and contacts a surface of one of the second electrically conductive structures that contacts a surface of an underlying first electrically conductive structure, and the other of the sacrificial conductive pads has a second area, different from the first area, and contacts a surface of another of the second electrically conductive structures that contacts a surface of a top electrode of the patterned material stack. A plasma treatment is performed to induce an antenna effect and to convert a dielectric switching material of the patterned material stack into a conductive filament. After plasma treatment, the pair of sacrificial conductive pads is removed.

20 Claims, 9 Drawing Sheets

(56) References Cited

U.S. PATENT DOCUMENTS

| | | | |
|---|---|---|---|
| 9,691,968 B2* | 6/2017 | Ito | H01L 43/08 |
| 9,698,342 B2* | 7/2017 | Ito | H01L 27/228 |
| 9,985,203 B2 | 5/2018 | Chen et al. | |
| 9,997,700 B2 | 6/2018 | Abdelmoula et al. | |
| 2014/0264234 A1 | 9/2014 | Tu et al. | |
| 2016/0072048 A1* | 3/2016 | Ito | H01L 43/02 |
| | | | 257/421 |
| 2016/0079308 A1* | 3/2016 | Ito | H01L 43/08 |
| | | | 257/421 |
| 2016/0359108 A1 | 12/2016 | Majhi et al. | |
| 2017/0178955 A1* | 6/2017 | Jiang | H01L 21/31138 |
| 2018/0350876 A1 | 12/2018 | Lee et al. | |
| 2019/0181339 A1 | 6/2019 | Lai et al. | |
| 2020/0127053 A1* | 4/2020 | Chen | H01L 43/12 |
| 2020/0365655 A1* | 11/2020 | Chiu | H01L 45/146 |
| 2021/0036057 A1* | 2/2021 | Hsieh | H01L 45/1233 |
| 2021/0043683 A1* | 2/2021 | Chiang | G11C 11/161 |
| 2021/0119122 A1* | 4/2021 | Ando | G11C 13/0069 |

FOREIGN PATENT DOCUMENTS

| | | |
|---|---|---|
| WO | 2014194069 A2 | 12/2014 |
| WO | 2019055052 A1 | 3/2019 |

OTHER PUBLICATIONS

International Search Report dated Feb. 9, 2021 received in a corresponding foreign application, 8 pages.

* cited by examiner

LOW FORMING VOLTAGE NON-VOLATILE MEMORY (NVM)

BACKGROUND

The present application relates to non-volatile memory (NVM), and more particularly to a low forming voltage resistive random access memory (ReRAM or RRAM) device and a method of forming the same.

Non-volatile memory (NVM) is a type of computer memory that can retrieve stored information even after having been power cycled. In contrast, volatile memory needs constant power in order to retain data. Resistive random access memory (ReRAM or RRAM) is a type of NVM that works by changing the resistance across a dielectric material, often referred to as a memristor. The basic idea is that a dielectric material, which is normally insulating, can be made to conduct through a filament or conduction path formed after application of a sufficiently high voltage. The conduction path can arise from different mechanisms, including vacancy or metal defect migration. Once the filament is formed, it may be reset (broken, resulting in high resistance) or set (re-formed, resulting in lower resistance) by another voltage.

Typical filament forming voltages for a dielectric metal oxide such as, for example, hafnium oxide, are from 3 volts to 3.5 volts. Such high filament forming voltages are not compatible with existing ReRAM devices. For example, existing 14 nm ReRAM devices require a forming voltage of about 2 volts or less.

In some ReRAM devices, a plasma treatment process can be used to pre-form a filament in the ReRAM due to the antenna effect. The term "antenna effect" is used throughout the present application to describe the charge accumulation effect in an isolated mode of an electronic circuit component during processing. Such charge accumulation often occurs due to the charges generated during the plasma process. Those charges are then collected via exposed metallic surfaces and start to be accumulated in an isolated mode. Such accumulation of charge may induce voltage difference. Then, a certain voltage may be applied to the device if the device is placed between two different isolated nodes. The voltage difference may eventually lead to a flow of current or apply an electrical stress on the device. In such ReRAM devices, the top electrode and the bottom electrode are connected to long conductive pads or long wires to collect charging during the plasma treatment, but the total areas are unbalanced and induce soft breakdown across the dielectric metal oxide using the antenna effect. The large conductive pads or wires, which are permanent components of such ReRAM devices, penalize the area for the device design.

In other ReRAM devices, a low forming voltage or forming free voltage ReRAM device can be obtained using an oxygen scavenging material such as a rare earth element. The use of an oxygen scavenging material within the ReRAM device is oftentimes not compatible with materials that are present in the back-end-of-the-line (BEOL).

There is thus a need for providing a low forming voltage ReRAM that circumvents the various problems mentioned above for conventional low forming voltage ReRAM devices.

SUMMARY

A low forming voltage NVM device is provided by forming a pair of sacrificial conductive pads on an interconnect dielectric material layer that embeds a pair of second electrically conductive structures and a patterned material stack. One of the sacrificial conductive pads has a first area and contacts a surface of one of the second electrically conductive structures that contacts a surface of an underlying first electrically conductive structure, and the other of the sacrificial conductive pads has a second area that is different from (i.e., greater than or lesser than) the first area and contacts a surface of another of the second electrically conductive structures that contacts a surface of a top electrode of the patterned material stack. A plasma treatment is performed to induce an antenna effect and to convert a dielectric switching material of the patterned material stack into a conductive filament. After plasma treatment, the pair of sacrificial conductive pads is removed.

In one aspect of the present application, a non-volatile memory (NVM) device is provided. In one embodiment, the NVM device includes a first electrically conductive structure embedded in a first interconnect dielectric material layer. A resistive random access memory (ReRAM) device is located on the first electrically conductive structure, wherein the ReRAM device includes a bottom electrode, a conductive filament composed of a dielectric switching material, and a top electrode. A second interconnect dielectric material layer is located on the first interconnect dielectric material layer and embeds the ReRAM device. In accordance with the present application, the second interconnect dielectric material layer contains an undulating upper surface having divots present therein. A pair of second electrically conductive structures is present in the second interconnect dielectric material layer, wherein one of the second electrically conductive structures of the pair of second electrically conductive structures contacts a surface of the first electrically conductive structure, and the other of the second electrically conductive structures of the pair of second electrically conductive structures contacts a surface of the top electrode of the ReRAM device.

In another aspect of the present application, a method of forming a non-volatile memory (NVM) device is provided. In one embodiment, the method includes forming a bottom electrode on a surface of a first electrically conductive structure that is embedded in a first interconnect dielectric material layer. A patterned material stack including, from bottom to top, a dielectric switching material and a top electrode is then formed on the bottom electrode. A second interconnect dielectric material layer is then formed above the first interconnect dielectric material layer, wherein the patterned material stack is embedded in the second interconnect dielectric material layer. Next, a pair of second electrically conductive structures is formed in the second interconnect dielectric material layer, wherein one of the second electrically conductive structures of the pair of second electrically conductive structures contacts a surface of the first electrically conductive structure, and the other of the second electrically conductive structures of the pair of second electrically conductive structures contacts a surface of the top electrode of the patterned material stack. A pair of sacrificial conductive pads is then formed on the second interconnect dielectric material layer, wherein one of the sacrificial conductive pads of the pair of sacrificial conductive pads has a first area and contacts a surface of the second electrically conductive structure of the pair of second electrically conductive structures that contacts the surface of the first electrically conductive structure, and the other of the sacrificial conductive pads of the pair of sacrificial conductive pads has a second area that is different from (i.e., greater than or lesser than) the first area and contacts a surface of the second electrically conductive structure of the pair of second electrically conductive structures that contacts the surface of the top electrode of the patterned material stack. Next, a plasma treatment is performed to induce an antenna effect and to convert the dielectric switching material into a conductive filament of a ReRAM device that further includes the bottom electrode and the top electrode. After forming the conductive filament, the pair of sacrificial conductive pads is removed from the second interconnect dielectric material layer.

BRIEF DESCRIPTION OF THE DRAWINGS

FIG. 10 is a cross sectional view of the BEOL structure of FIG. 9 after patterning the conductive metal-containing pad layer to provide a pair of sacrificial conductive pads, wherein one of the sacrificial conductive pads of the pair of sacrificial conductive pads has a first area and contacts a surface of the second electrically conductive structure of the pair of second electrically conductive structures that contacts the surface of the first electrically conductive structure, and the other of the sacrificial conductive pads of the pair of sacrificial conductive pads has a second area that is different from (i.e., greater than or lesser than) the first area and contacts a surface of the second electrically conductive structure of the pair of second electrically conductive structures that contacts the surface of the remaining portion of the top electrode layer of the patterned material stack.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

It is noted that the drawings of the present application illustrate a memory device area of a BEOL structure in which a NVM device (i.e., a low forming voltage ReRAM device) is present. Non-memory device areas of the BEOL structure lie to the periphery of the memory device area shown in the drawings. The non-memory device areas may include other BEOL devices including, for example, BEOL resistors, or interconnect structures.

Figure 1:
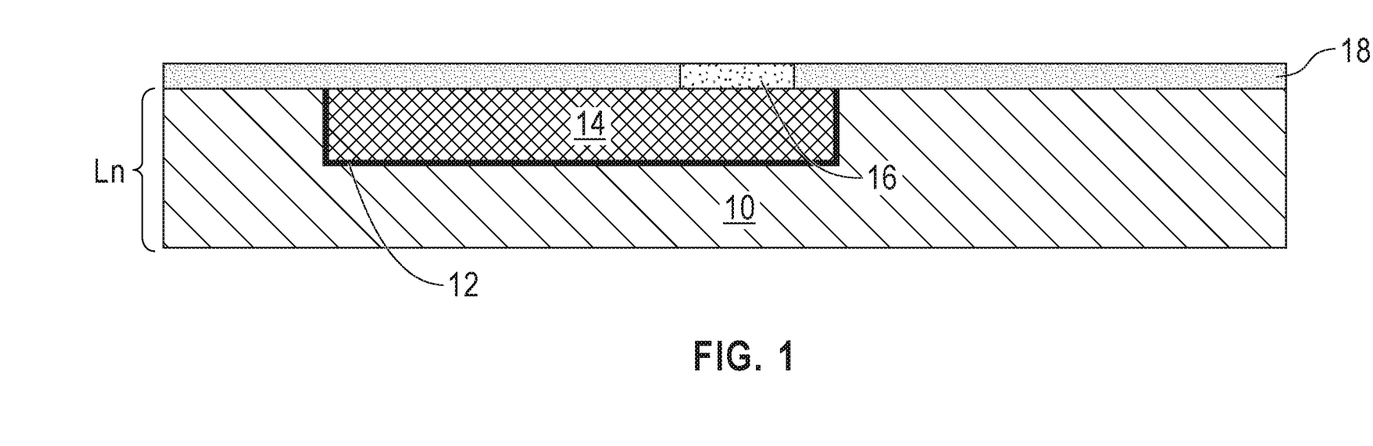
FIG. 1 is a cross sectional view of a BEOL structure that can be employed in accordance with an embodiment of the present application, the BEOL structure includes a bottom electrode that is located on a surface of a first electrically conductive structure that is embedded in a first interconnect dielectric material layer.

Referring now to FIG. 1, there is illustrated a BEOL structure that can be employed in accordance with an embodiment of the present application, the BEOL structure includes a bottom electrode 16 that is located on a surface of a first electrically conductive structure 14 that is embedded in a first interconnect dielectric material layer 10. In some embodiments, a diffusion barrier liner 12 can be located on a sidewall and bottommost surface of the first electrically conductive structure 14. Collectively, the first electrically conductive structure 14, the optional diffusion barrier liner 12, and the first interconnect dielectric material layer 10 provide an interconnect level, $L_n$, of the BEOL structure wherein n is an integer starting a 1.

Although not shown, interconnect level, $L_n$, is present on a front-end-of-the-line (FEOL) level that includes one or more CMOS devices. In some embodiments (also not shown), a metal level, $L_{n-1}$, can be located between the interconnect level, $L_n$, and the FEOL level. In some embodiments, and when n is 1, metal level, $L_{n-1}$, is a middle-of-the-line (MOL) level. In other embodiments, and when n is 2, 3, 4, etc, metal level, $L_{n-1}$, is a lower interconnect level that is positioned beneath interconnect level, $L_n$. In either embodiment, metal level, $L_{n-1}$, includes a dielectric material layer that contains at least one metal level electrically conductive structure embedded therein that is connected, either directly or indirectly, to an underlying CMOS device (not shown) that is present in a FEOL level (also not shown).

When n is 1, the dielectric material layer of metal level, $L_{n-1}$, can be composed of a MOL dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants expressed herein are measured in a vacuum). Also, and in such an embodiment (i.e., when n is 1), the at least one metal level electrically conductive structure is a contact structure that includes a contact metal or a contact metal alloy such as, for example, tungsten (W), cobalt (Co), platinum (Pt), nickel (Ni) or alloys thereof.

When n is greater than 1, the dielectric material layer of metal level, $L_{n-1}$, can be composed of an interconnect dielectric material such as, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. Also, and in such an embodiment (i.e., when n is greater than 1), the at least one metal level electrically conductive structure is composed of an electrically conductive metal or an electrically conductive metal alloy. Examples of electrically conductive materials that can be used in the present application include copper (Cu), aluminum (Al), or tungsten (W), while an example of an electrically conductive metal alloy is a Cu—Al alloy.

The first interconnect dielectric material layer 10 of interconnect level, $L_n$, can be composed of one of the interconnect dielectric materials mentioned above for the dielectric material layer of metal level, $L_{n-1}$. The first interconnect dielectric material layer 10 can be formed utilizing a conventional deposition process such as, for example, chemical vapor deposition (CVD), plasma enhanced chemical vapor deposition (PECVD), chemical solution deposition, evaporation, or atomic layer deposition (ALD). In one embodiment, the first interconnect dielectric material layer 10 can have a thickness (i.e., vertical height) from 50 nm to 200 nm. Other thicknesses for the first interconnect dielectric material layer 10 are possible and can be used in the present application as the thickness of the first interconnect dielectric material layer 10.

The first electrically conductive structure 14 that is embedded in the first interconnect dielectric material layer 10 can be composed of one of the electrically conductive metals or electrically conductive metal alloys mentioned above for the at least one metal level electrically conductive structure. The electrically conductive metal or electrically conductive metal alloy that provides the first electrically conductive structure 14 can be formed utilizing a conventional deposition process such as, for example, CVD, PECVD, sputtering, chemical solution deposition or plating. In one embodiment, a bottom-up plating process is employed in forming the electrically conductive metal or electrically conductive metal alloy that provides the first electrically conductive structure 14.

As mentioned above, and in some embodiments, diffusion barrier liner 12 is present along a sidewall and a bottommost surface of the first electrically conductive structure 14. In some embodiments (not illustrated), no diffusion barrier liner is present. The diffusion barrier liner 12 is composed of a diffusion barrier material (i.e., a material that serves as a barrier to prevent a conductive material such as copper from diffusing there through). Examples of diffusion barrier materials that can be used in providing the diffusion barrier liner 12 include, but are not limited to, Ta, TaN, Ti, TiN, Ru, RuN, RuTa, RuTaN, W, or WN. In some embodiments, the diffusion barrier material can include a material stack of diffusion barrier materials. In one example, the diffusion barrier material can be composed of a stack of Ta/TaN. The diffusion barrier material can be formed by a deposition process including, for example, CVD, PECVD, ALD, physical vapor deposition (PVD), sputtering, chemical solution deposition or plating.

Interconnect level, $L_n$, can be formed utilizing any conventional process that is well-known to those skilled in the art. So as to not obscure the method of the present application, the process used to form interconnect level, $L_n$, is not provided herein. In one embodiment, a damascene process can be used in forming the interconnect level, $L_n$. A damascene process can include forming an opening into a dielectric material, filling the opening with an electrically conductive metal-containing material and, if needed, performing a planarization process such as, for example, chemical mechanical polishing (CMP) and/or grinding.

In some embodiments, the first electrically conductive structure 14 has a topmost surface that is coplanar with a topmost surface of the first interconnect dielectric material layer 10, and if present, a topmost surface of the diffusion barrier liner 12.

After forming interconnect level, $L_n$, bottom electrode 16 is formed on a surface of the first electrically conductive structure 14; the bottom electrode 16 forms an interface with the first electrically conductive structure 14. The bottom electrode 16 has an area that is smaller than an area of the first electrically conductive structure 14 such that a portion of the first electrically conductive structure 14 is available for subsequent contact formation. The bottom electrode 16 is composed of an oxygen deficient conductive material such as, for example, Cu, Ta, TaN, Ti, TiN, Ru, RuN, RuTa, RuTaN, Co, CoWP, CoN, W, WN or any combination thereof. The bottom electrode 16 can have a thickness from 2 nm to 80 nm; other thicknesses are possible and can be used in the present application as the thickness of the bottom electrode 16. The bottom electrode 16 can be formed by a deposition process such as, for example, sputtering, electroplating, electroless plating, ALD, CVD, PECVD or PVD. In some embodiments, an etch back process, a planarization process (such as, for example, chemical mechanical polishing), or a patterning process (such as, for example, photolithography and etching) can follow the deposition of the conductive material that provides the bottom electrode 16.

In some embodiments, and as shown in FIG. 1, the bottom electrode 16 is formed on a topmost surface of the first electrically conductive structure 14 and the bottom electrode 16 is embedded in a dielectric capping layer 18. The dielectric capping layer 18 can be composed of any dielectric capping material including, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The dielectric capping material that provides the dielectric capping layer 18 is compositionally different from the first interconnect dielectric material layer 10. The dielectric capping material that provides the dielectric capping layer 18 can be formed utilizing a deposition process such as, for example, CVD, PECVD, ALD, chemical solution deposition or evaporation.

In one embodiment, the dielectric capping layer 18 is formed on an entirety of the interconnect level, $L_n$, including the first interconnect dielectric material layer 10, the first electrically conductive structure 14, and, if present, the diffusion barrier liner 12. An opening is then formed, by photolithography and etching, into the dielectric capping layer 18. The opening that is formed into the dielectric capping layer 18 physically exposes a surface of the first electrically conductive structure 14. Next, bottom electrode 16 is formed into the opening that is present in the dielectric capping layer 18.

In another embodiment, the bottom electrode 16 is formed by deposition and patterning, and thereafter, dielectric capping layer 18 is formed laterally adjacent to the bottom electrode 16.

In some embodiments (not illustrated), the bottom electrode 16 can be formed on a recessed surface of the first electrically conductive structure 14. Recessing of the first electrically conductive structure 14 includes a recess etch; the recess etch can also recess the diffusion barrier liner 12 if the same is present in the structure. In embodiments in which the bottom electrode 16 is formed on a recessed surface of the first electrically conductive structure 14, the dielectric capping layer 18 can be omitted from the structure, and the bottom electrode 16 can have a topmost surface that is coplanar with, or beneath, a topmost surface of the first interconnect dielectric material layer 10.

Figure 2:
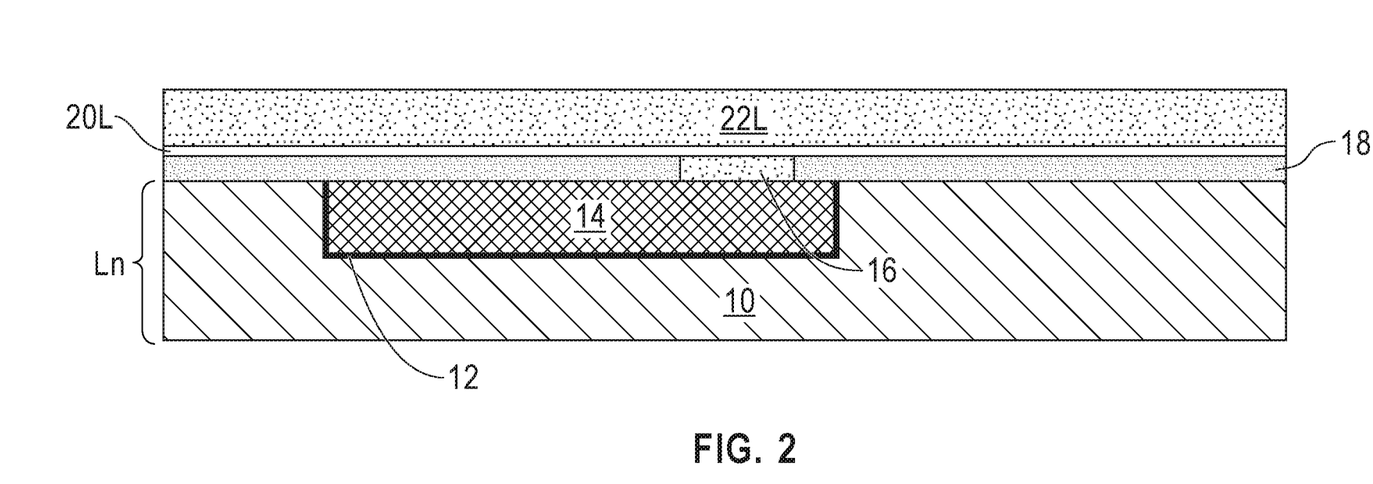
FIG. 2 is a cross sectional view of the BEOL structure of FIG. 1 after forming a dielectric switching layer and a top electrode layer.

Referring now to FIG. 2, there is illustrated the BEOL structure of FIG. 1 after forming a dielectric switching layer 20L and a top electrode layer 22L. As is shown, the dielectric switching layer 20L contacts at least one surface of at least the bottom electrode 16. Thus, the dielectric switching layer 20L forms an interface with the bottom electrode 16.

The dielectric switching layer 20L is a dielectric material such as a dielectric metal oxide that has a dielectric constant of greater than 4.0. The dielectric switching layer 20L is electrically insulating at this point of the present application and during plasma treatment the dielectric switching layer 20L is converted into a filament that is electrically conducting. Examples of dielectric metal oxides that can be employed as the dielectric switching layer 20L include, but are not limited to, hafnium oxide ($HfO_x$), tantalum oxide ($TaO_x$), titanium oxide ($TiO_x$), aluminum oxide ($AlO_x$), or combinations thereof. The dielectric switching layer 20L can be formed utilizing a deposition process such as, for example, CVD, PECVD, ALD, chemical solution deposition or evaporation. The dielectric switching layer 20L can have a thickness from 1 nm to 50 nm; other thicknesses however are contemplated can be used as the thickness of the dielectric switching layer 20L.

The top electrode layer 22L, which forms an interface with the dielectric switching layer 20L, can be composed of one of oxygen deficient conductive materials mentioned above for the bottom electrode 16. In one embodiment, the top electrode layer 22L is composed of an oxygen deficient conductive material that is compositionally the same as the oxygen deficient conductive material that provides the bottom electrode 16. In another embodiment, the top electrode layer 22L is composed of an oxygen deficient conductive material that is compositionally different from the oxygen deficient conductive material that provides the bottom electrode 16. The top electrode layer 22L can have a thickness from 2 nm to 80 nm; other thicknesses are possible and can be used in the present application as the thickness of the top electrode 22L. The top electrode layer 22L can be formed by a deposition process such as, for example, sputtering, electroplating, electroless plating, ALD, CVD, PECVD or PVD.

Figure 3:
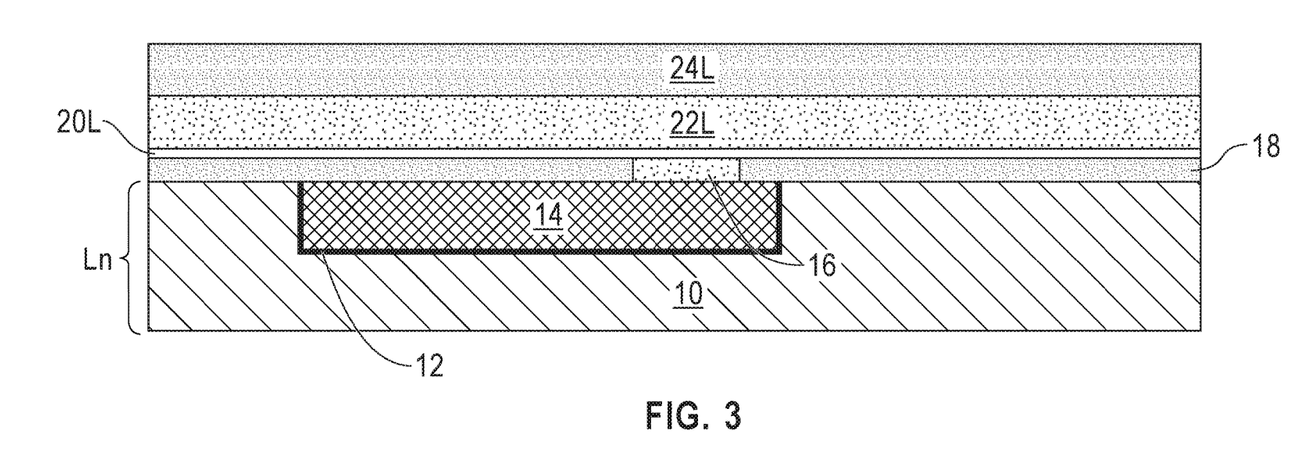
FIG. 3 is a cross sectional view of the BEOL structure of FIG. 2 after forming a dielectric hard mask layer on the top electrode layer.

Referring now to FIG. 3, there is illustrated the BEOL structure of FIG. 2 after forming a dielectric hard mask layer 24L on the top electrode layer 22L. In some embodiments, dielectric hard mask layer 24L formation can be omitted. When present, the dielectric hard mask layer 24L is a continuous layer that covers an entirety of the top electrode layer 22L. The dielectric hard mask layer 24L is composed of a dielectric hard mask material such as, for example, silicon dioxide, silicon nitride, silicon oxynitride or any combination thereof. The dielectric hard mask layer 24L can be formed utilizing a deposition process such as, for example, CVD, PECVD, ALD, chemical solution deposition or evaporation. The dielectric hard mask layer 24L can have a thickness from 10 nm to 15 nm; other thicknesses however are contemplated can be used as the thickness of the dielectric hard mask layer 24L.

Figure 4:
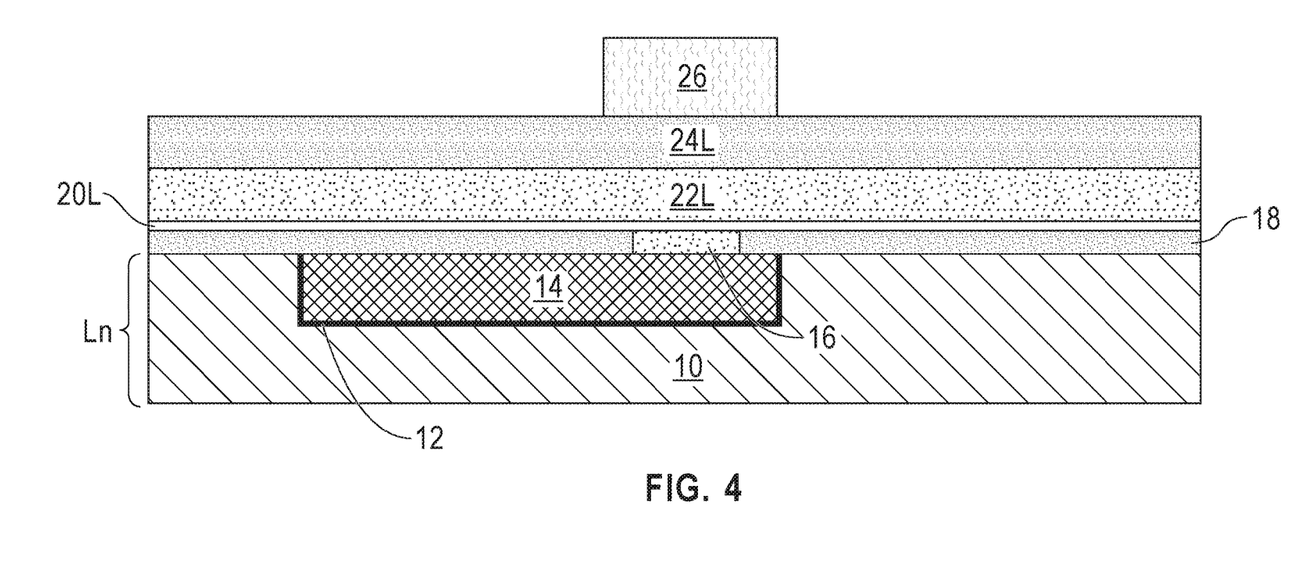
FIG. 4 is cross sectional view of the BEOL structure of FIG. 3 after forming a patterned photoresist mask on a surface of the dielectric hard mask layer.

Referring now to FIG. 4, there is illustrated the BEOL structure of FIG. 3 after forming a patterned photoresist mask 26 on a surface of the dielectric hard mask layer 24L. The patterned photoresist mask 26 is located directly over an area of the structure including the bottom electrode 16 and is used in defining a pillar shaped patterned material stack of a remaining portion of the dielectric hard mask layer 24L, a remaining portion of the top electrode layer 22L, and a remaining portion of the dielectric switching layer 20L. The patterned photoresist mask 26 is composed of a positive-tone photoresist material, a negative-tone photoresist material or a hybrid-tone photoresist material. The patterned photoresist mask 26 can be formed by deposition of an appropriate photoresist material, and thereafter patterning the deposited photoresist material by photolithography.

Figure 5:
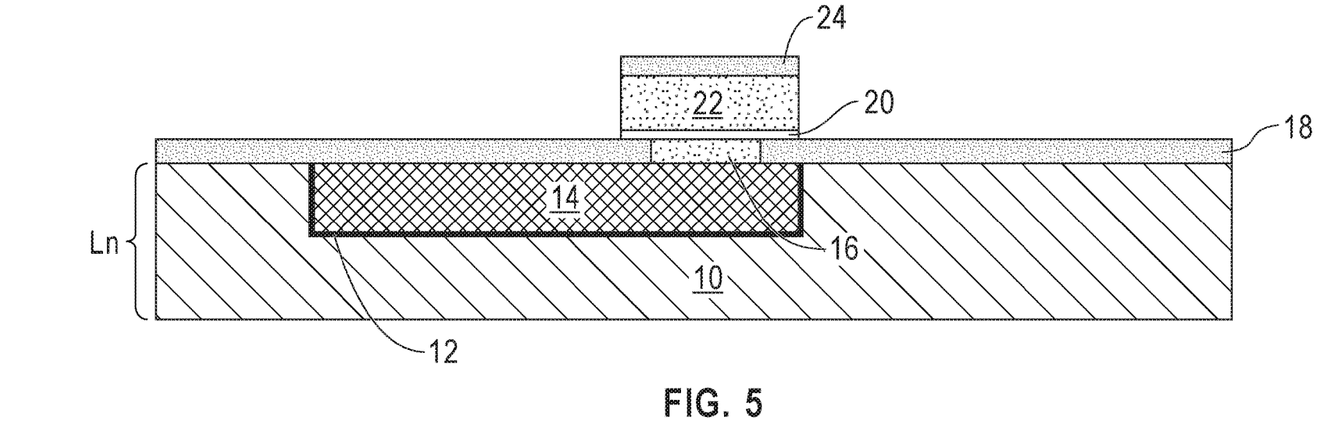
FIG. 5 is a cross sectional view of the BEOL structure of FIG. 4 after patterning the dielectric hard mask layer, the top electrode layer, and the dielectric switching layer to provide a patterned material stack of a remaining portion of the dielectric hard mask layer, a remaining portion of the top electrode layer, and a remaining portion of the dielectric switching layer, and removing the patterned photoresist mask.

Referring now to FIG. 5, there is illustrated the BEOL structure of FIG. 4 after patterning the dielectric hard mask layer 24L, the top electrode layer 22L, and the dielectric switching layer 20L to provide a patterned material stack of a remaining portion of the dielectric hard mask layer 24L (hereinafter dielectric hard mask 24), a remaining portion of the top electrode layer 22L (hereinafter top electrode 22), and a remaining portion of the dielectric switching layer 20L (hereinafter dielectric switching material 20), and removing the patterned photoresist mask 26.

The patterning of the dielectric hard mask layer 24L, the top electrode layer 22L, and the dielectric switching layer 20L includes an etching process such as, for example, reactive ion etching (RIE) or ion beam etching (IBE). The patterning of the dielectric hard mask layer 24L, the top electrode layer 22L, and the dielectric switching layer 20L utilizes the patterned photoresist mask 26 as an etch mask. The patterned photoresist mask 26 can be removed from the BEOL structure anytime after the pattern has been transferred into at least the dielectric hard mask layer 24L. The patterned photoresist mask 26 can be removed utilizing a conventional resist stripping process such as, for example, ashing. In some embodiments, a wet cleaning process follows the formation of the patterned material stack (20/22/24).

In some embodiments and as shown in FIG. 5, the various elements/components that define the patterned material stack (20/22/24) have a sidewall(s) that is(are) vertically aligned to each other. In some embodiments, the patterned material stack (20/22/24) is cylindrical in shape. In some embodiments (and as is shown in FIG. 5), the patterned material stack (20/22/24) has a width that can be larger than a width of the bottom electrode 16. Larger width patterned material stacks (20/22/24) avoid the resputtering of bottom electrode metallic particles on the sidewall(s) of the patterned material stack (20/22/24) which may cause the device to short. In other embodiments (not shown), the patterned material stack (20/22/24) has a width that can be the same width as that of the bottom electrode 16; this also avoids resputtering of bottom electrode metallic particles onto the sidewall(s) of the patterned material stack (20/22/24).

Figure 6:
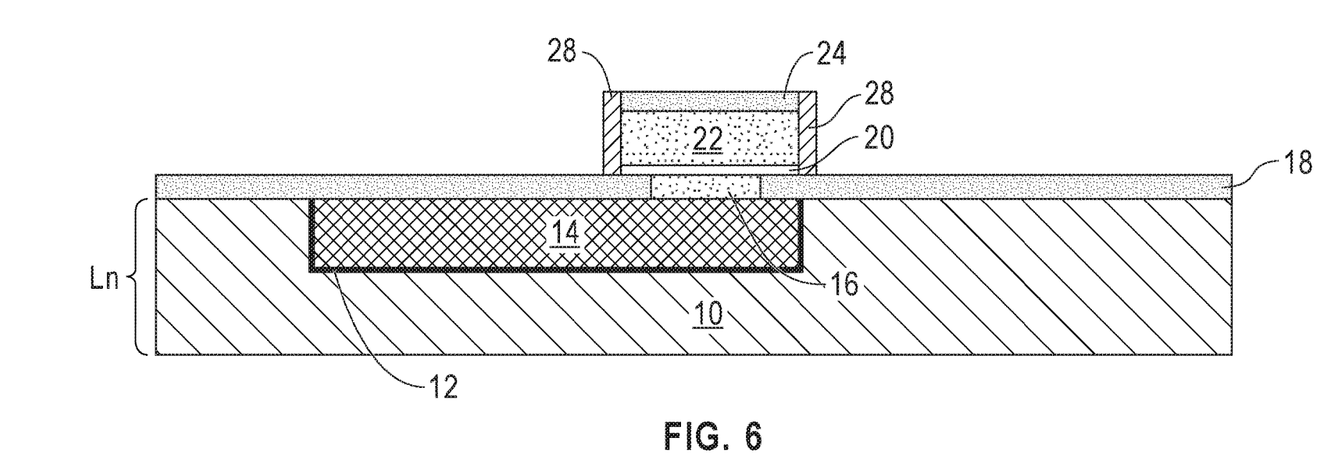
FIG. 6 is a cross sectional view of the BEOL structure of FIG. 5 after forming a dielectric spacer on a sidewall of the patterned material stack.

Referring now to FIG. 6, there is illustrated the BEOL structure of FIG. 5 after forming a dielectric spacer 28 on a sidewall of the patterned material stack (20/22/24). The dielectric spacer 28 can include any dielectric spacer material including, for example, silicon dioxide, silicon nitride, silicon oxynitride, SiCN, SiCON or any combination thereof. The dielectric spacer material that provides the dielectric spacer 28 can be compositionally the same as, or compositional different from, the hard mask material that provides dielectric hard mask 24. The dielectric spacer 28 can be formed by deposition of a dielectric spacer material, followed by a spacer etch.

Figure 7:
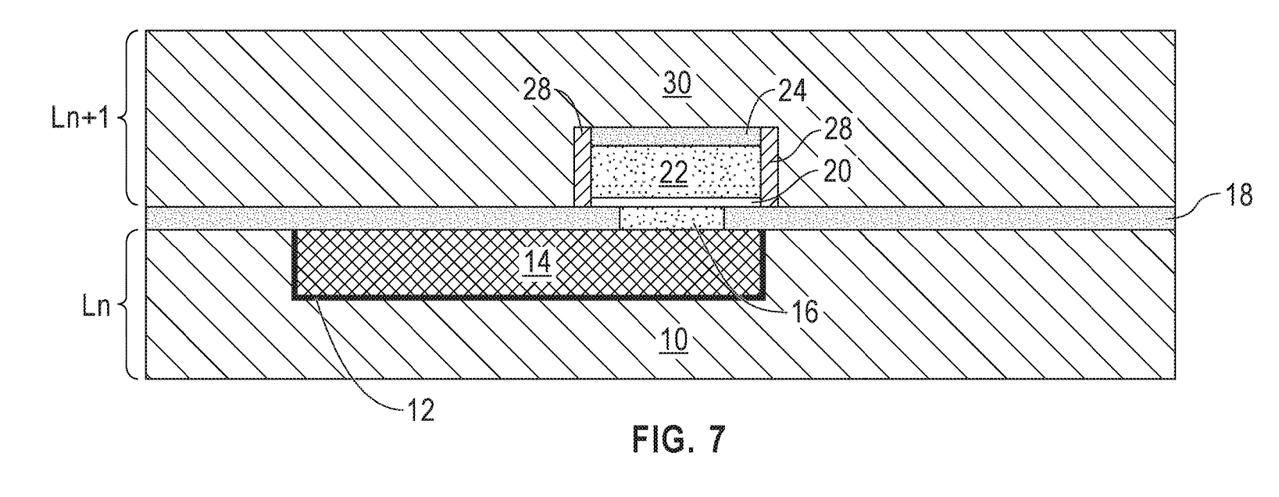
FIG. 7 is a cross sectional view of the BEOL structure of FIG. 6 after forming a second interconnect dielectric material layer above the first interconnect dielectric material layer, wherein the dielectric spacer containing patterned material stack is embedded in the second interconnect dielectric material layer.

Referring now to FIG. 7, there is illustrated the BEOL structure of FIG. 6 after forming a second interconnect dielectric material layer 30 above the first interconnect dielectric material layer 10, wherein the second interconnect dielectric material layer 30 embeds the dielectric spacer 28 containing patterned material stack (20/22/24) therein. The second interconnect dielectric material layer 30 may include one of the interconnect dielectric materials mentioned above for the first interconnect dielectric material layer 10. In one embodiment, the second interconnect dielectric material layer 30 can be composed of an interconnect dielectric material that is compositionally the same as the interconnect dielectric material that provides the first interconnect dielectric material layer 10. In another embodiment, the second interconnect dielectric material layer 30 can be composed of an interconnect dielectric material that is compositionally different from the interconnect dielectric material that provides the first interconnect dielectric material layer 10. The second interconnect dielectric material layer 30 can be formed utilizing one of the deposition processes mentioned above for forming the first interconnect dielectric material layer 10. The second interconnect dielectric material layer 30 has a thickness that greater than the thickness of the patterned material stack (20/22/24). In one embodiment, the second interconnect dielectric material layer 30 has a thickness from 50 nm to 500 nm. Second interconnect dielectric material layer 30 forms a second interconnect level, $L_{n+1}$, of the BEOL structure.

Figure 8:
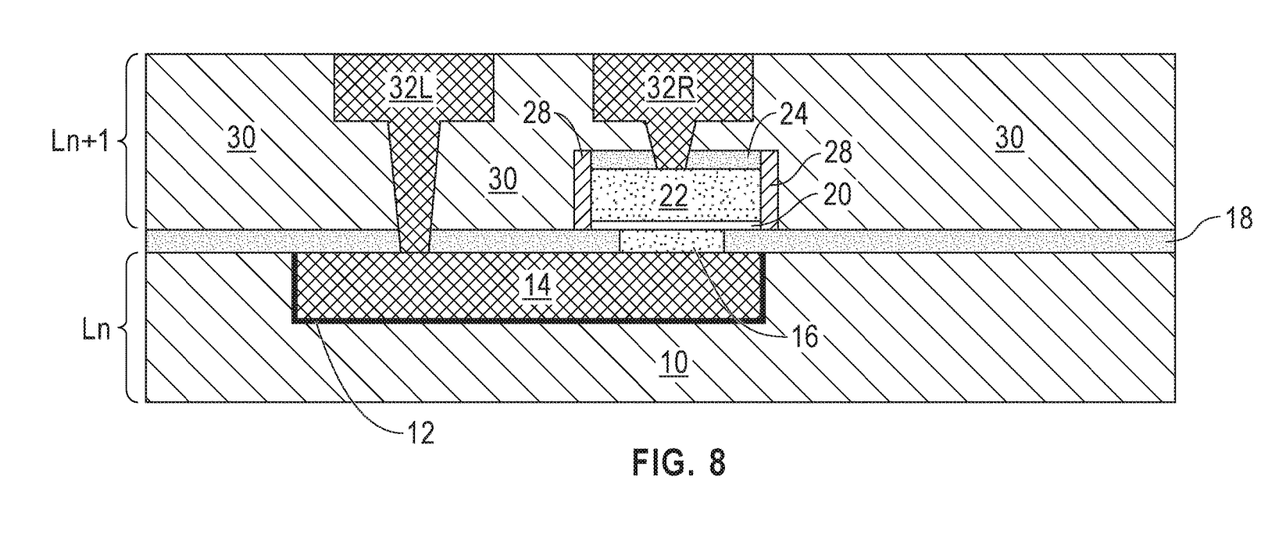
FIG. 8 is a cross sectional view of the BEOL structure of FIG. 7 after forming a pair of second electrically conductive structures in the second interconnect dielectric material layer, wherein one of the second electrically conductive structures of the pair of second electrically conductive structures contacts a surface of the first electrically conductive structure, and the other of the second electrically conductive structures of the pair of second electrically conductive structures contacts a surface of the remaining portion of the top electrode layer of the patterned material stack.

Referring now to FIG. 8, there is illustrated the BEOL structure of FIG. 7 after forming a pair of second electrically conductive structures (32L, 32R) in the second interconnect dielectric material layer 30, wherein one of the second electrically conductive structures (i.e., second electrically conductive structure 32L) of the pair of second electrically conductive structures (32L, 32R) contacts a surface of the first electrically conductive structure 14, and the other of the second electrically conductive structures (i.e., second electrically conductive structure 32R) of the pair of second electrically conductive structures (32L, 32R) contacts a surface of the remaining portion of the top electrode layer 22L (i.e., the top electrode 22) of the patterned material stack (20/22/24).

Each second electrically conductive structure of the pair of second electrically conductive structures (32L, 32R) is composed of one of the electrically conductive metals or electrically conductive metal alloys mentioned above for the first electrically conductive structure 14. In some embodiments, each second electrically conductive structure of the pair of second electrically conductive structures (32L, 32R) is composed of a compositionally same electrically conductive metal-containing material as the first electrically conductive structure 14. In other embodiments, each second electrically conductive structure of the pair of second electrically conductive structures (32L, 32R) is composed of a compositionally different electrically conductive metal-containing material than the first electrically conductive structure 14.

Each second electrically conductive structure of the pair of second electrically conductive structures (32L, 32R) can be formed utilizing a dual damascene process or any other process that forms an electrically conductive structure in an interconnect dielectric material. Each second electrically conductive structure of the pair of second electrically conductive structures (32L, 32R) has a topmost surface that is coplanar with a topmost surface of the second interconnect dielectric material layer 30.

Figure 9:
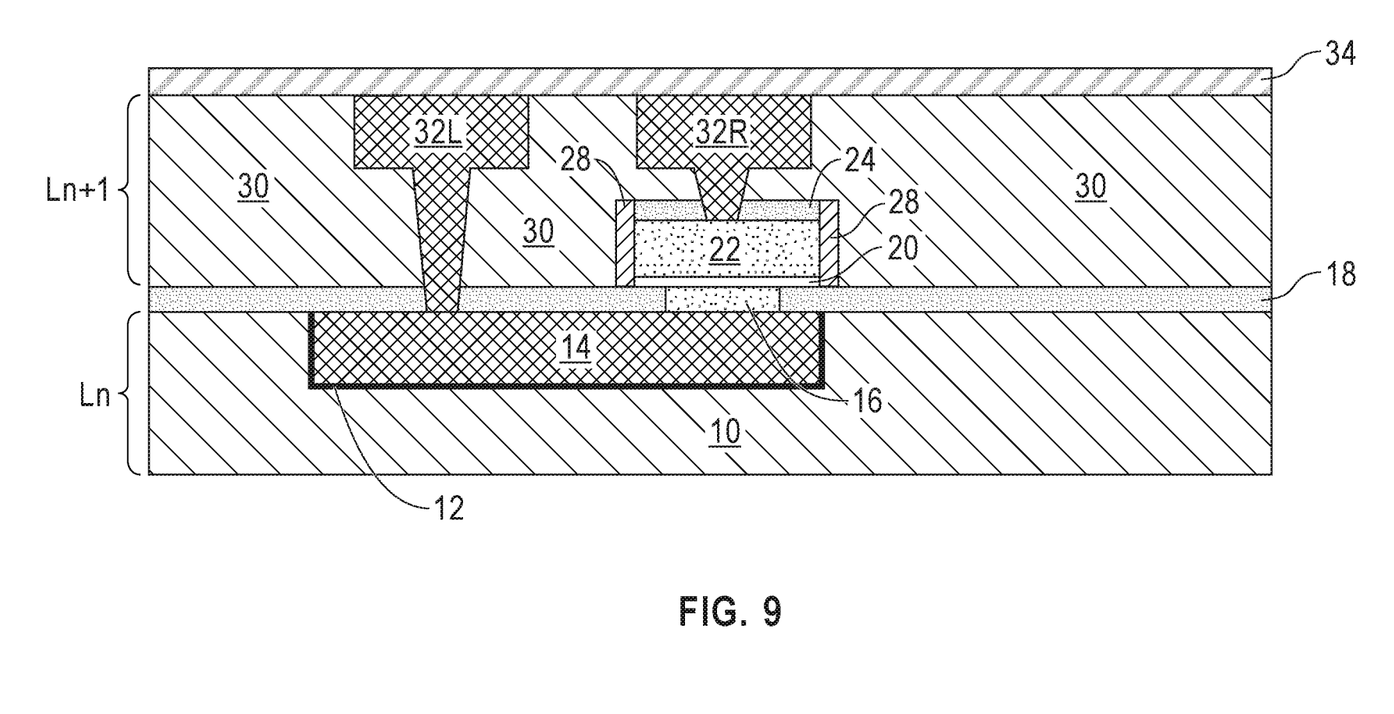
FIG. 9 is a cross sectional view of the BEOL structure of FIG. 8 after forming a conductive metal-containing pad layer on both the second interconnect dielectric material layer and the pair of second electrically conductive structures.

Referring now to FIG. 9, there is illustrated the BEOL structure of FIG. 8 after forming a conductive metal-containing pad layer 34 on both the second interconnect dielectric material layer 30 and the pair of second electrically conductive structures (32L, 32R). The conductive metal-containing pad layer 34 can be composed of a conductive metal nitride such as, for example, TaN, TiN, RuN, RuTaN, CoN, WN or any combination thereof. Other conductive metal-containing materials can be also used as the conductive metal-containing pad layer 34 besides, or in addition to, a conductive metal nitride. Conductive metal-containing pad layer 34 is compositionally different from the second electrically conductive structures (32L, 32R). The conductive metal-containing pad layer 34 can be formed utilizing a deposition process such as, for example, sputtering, electroplating, electroless plating, ALD, CVD, PECVD or PVD. The conductive metal-containing pad layer 34 can have a thickness from 5 nm to 50 nm; although other thicknesses are contemplated and can be used as the thickness of the conductive metal-containing pad layer 34.

Figure 10:
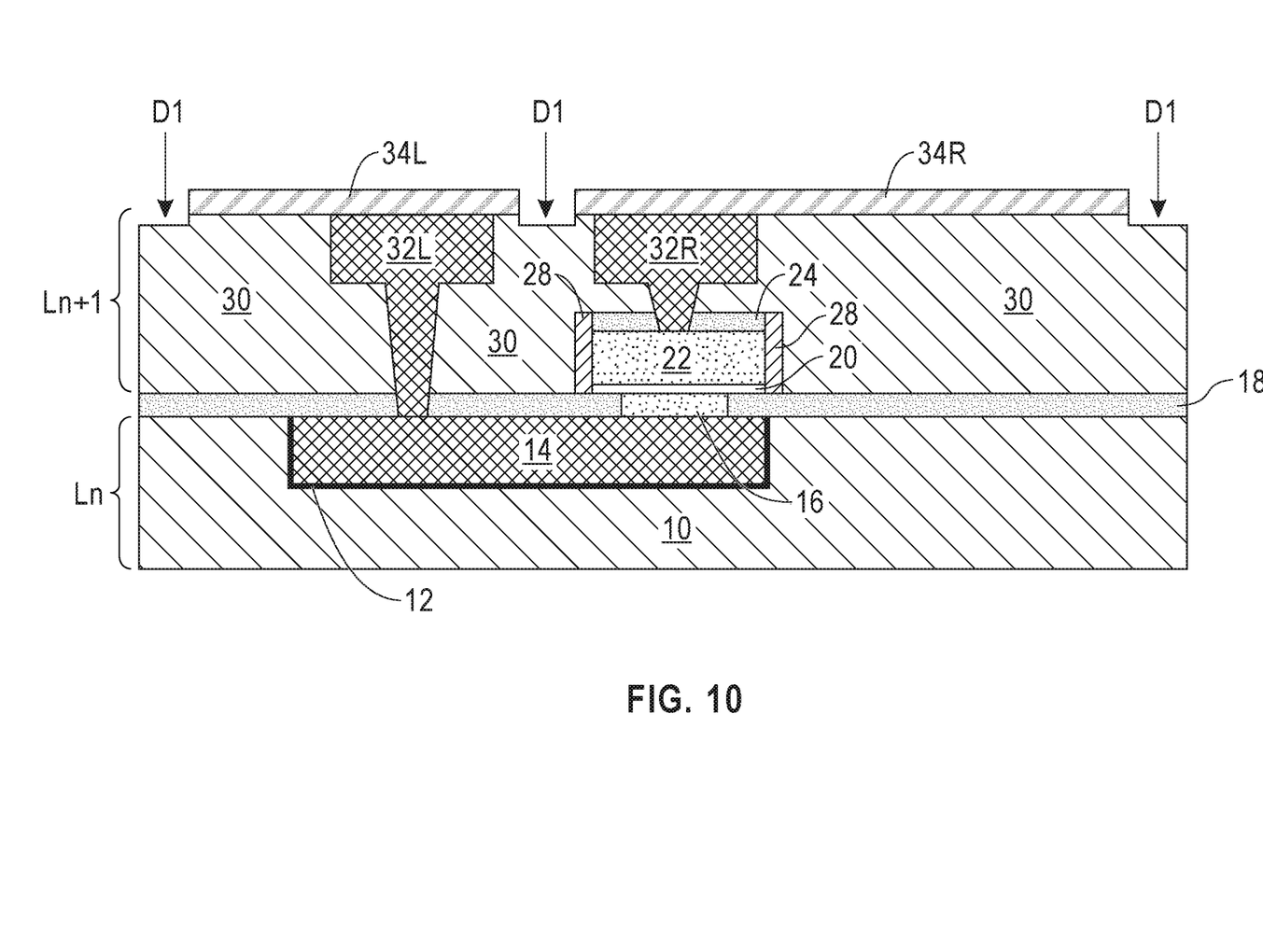

Referring now to FIG. 10, there is illustrated the BEOL structure of FIG. 9 after patterning the conductive metal-containing pad layer 34 to provide a pair sacrificial conductive pads (34L, 34R) wherein one of the sacrificial conductive pads (i.e., pad 34L) of the pair of sacrificial conductive pads (34L, 34R) has a first area and contacts a surface of the second electrically conductive structure 32L of the pair of second electrically conductive structures (32L, 32R) that contacts the surface of the first electrically conductive structure 14, and the other of the sacrificial conductive pads (i.e., pad 34R) of the pair sacrificial conductive pads (34L, 34R) has a second area that is different from (i.e., greater than or lesser than) the first area and contacts a surface of the second electrically conductive structure 32R of the pair of second electrically conductive structures (32L, 32R) that contacts the surface of the remaining portion of the top electrode layer (i.e., top electrode 22) of the patterned material stack (20/22/24). FIG. 10 shows the embodiment in which the sacrificial conductive pad 34R has a second area that is greater than the first area of sacrificial conductive pad 34L. In some embodiments, the first area of sacrificial conductive pad 34L can be larger than the second area of sacrificial conductive pad 34R.

The patterning of the conductive metal-containing pad layer 34 can include photolithography and etching. As mentioned above, the second area of sacrificial conductive pads 34R is different from (i.e., greater than or lesser than) the first area of sacrificial conductive pad 34L. The difference in area between the sacrificial conductive pads (34L, 34R) allows soft dielectric breakdown to occur across the dielectric switching material 20 using the antenna effect during a subsequently performed plasma treatment process. In one embodiment, a ratio of the second area to first area is greater than 1.2.

Figure 11:
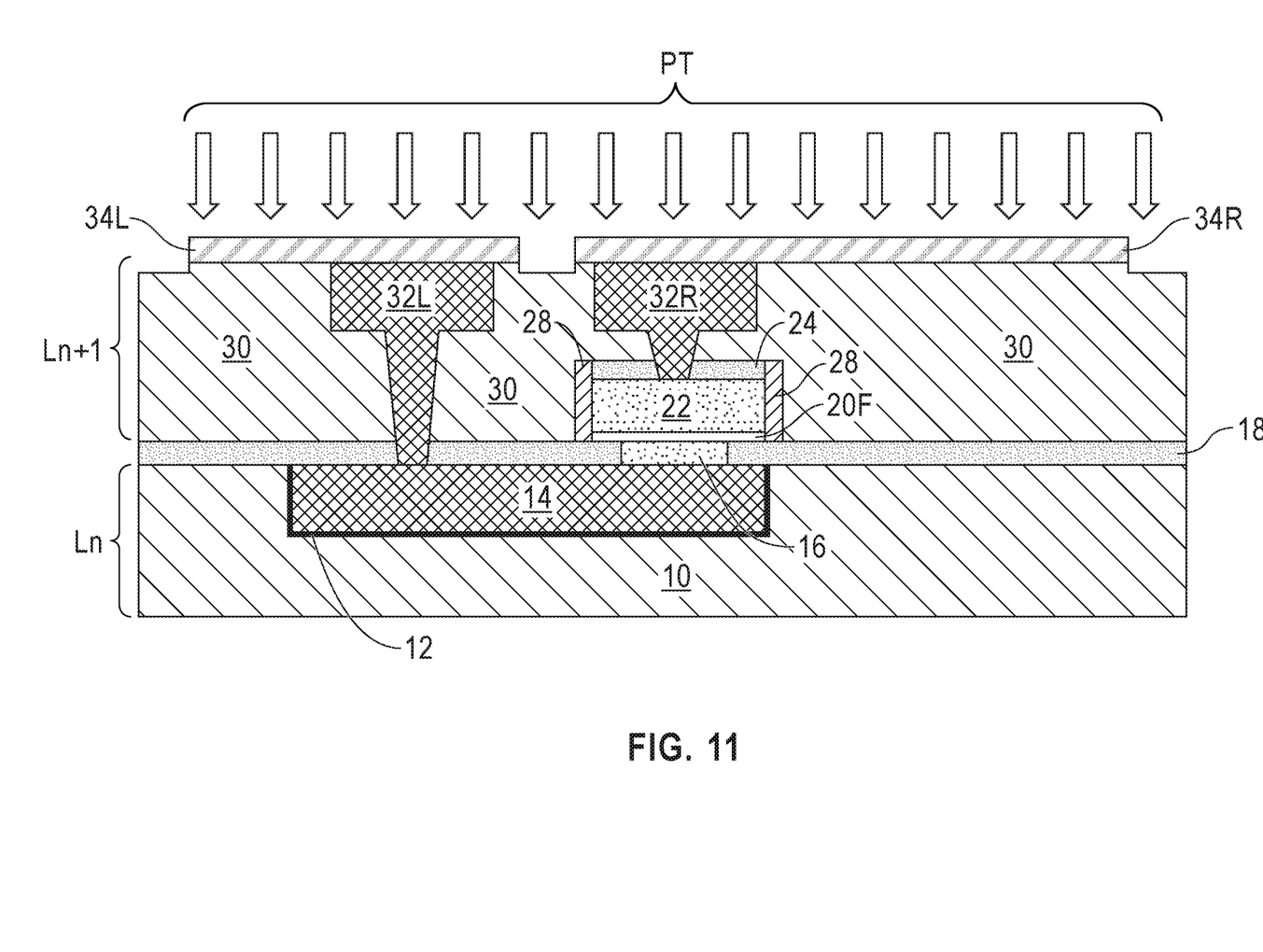
FIG. 11 is a cross sectional view of the BEOL structure of FIG. 10 after performing a plasma treatment to induce an antenna effect and to form a conductive filament of a ReRAM device.

It is noted that during the patterning of the conductive metal-containing pad layer 34, a divot, D1, is formed into the second interconnect dielectric material layer 30 adjacent to, and between, the pair of second electrically conductive structures (32L, 32R). Thus, the second interconnect dielectric material layer 30 now has an undulating upper surface that contains divots, D1, therein Referring now to FIG. 11, there is illustrated the BEOL structure of FIG. 10 after performing a plasma treatment (PT) to induce an antenna effect and to form a conductive filament 20F; the arrows in FIG. 11 show the direction of the plasma treatment. Conductive filament 20F is composed of switching dielectric material 20 that is now electrically conductive due to dielectric breakdown of the original switching dielectric material 20. The conductive nature of conductive filament 20F is temporary and reversible. Collectively, the bottom electrode 16, the conductive filament 20F, and the top electrode 22 form a ReRAM device of the present application. Subsequently and during use, the ReRAM device can include the bottom electrode 16, the dielectric switching material 20, and the top electrode 22. The ReRAM device is located in the BEOL and is embedded various dielectric materials.

Conductive filament 20F is a pre-formed filament. In the present application, the top electrode 22 and the bottom electrode 16 are connected to long sacrificial conductive pads (34L, 34R) to collect charging during the plasma treatment, but the total areas are unbalanced and induce soft dielectric breakdown across switching dielectric material 20 using the antenna effect. The large sacrificial conductive pads (34L, 34R) are subsequently removed from the structure thus eliminating an area penalty caused by the presence of permanent conductive landing pads in the final structure. Also, the pre-formed conductive filament 20F of the present application reduces the forming voltage to less than 2 volts as compared to 3 volts or greater as is required for prior art filament formation in ReRAM devices.

In one embodiment of the present application, the plasma treatment which is used to induce the antenna effect and to form conductive filament 20F can include a plasma treatment in which the BEOL structure shown in FIG. 10 is subjected to a plasma process that comprises a gas including, but not limited to, argon, nitrogen, hydrogen, xenon, ammonia or mixtures thereof. In some embodiments, the plasma process that can be used in the present application can include a pressure range from 1 mTorr to 3 Torr, a plasma power ranging from 0.1 kWatts to 10 kWatts, a bias voltage from 0 volts to 50 volts, and a duration for 5 seconds to 15 minutes. The plasma process can be performed using an inductively coupled plasma (ICP) tool, a capacitively coupled plasma (CCP) tool, or a microwave generated plasma tool.

Figure 12:
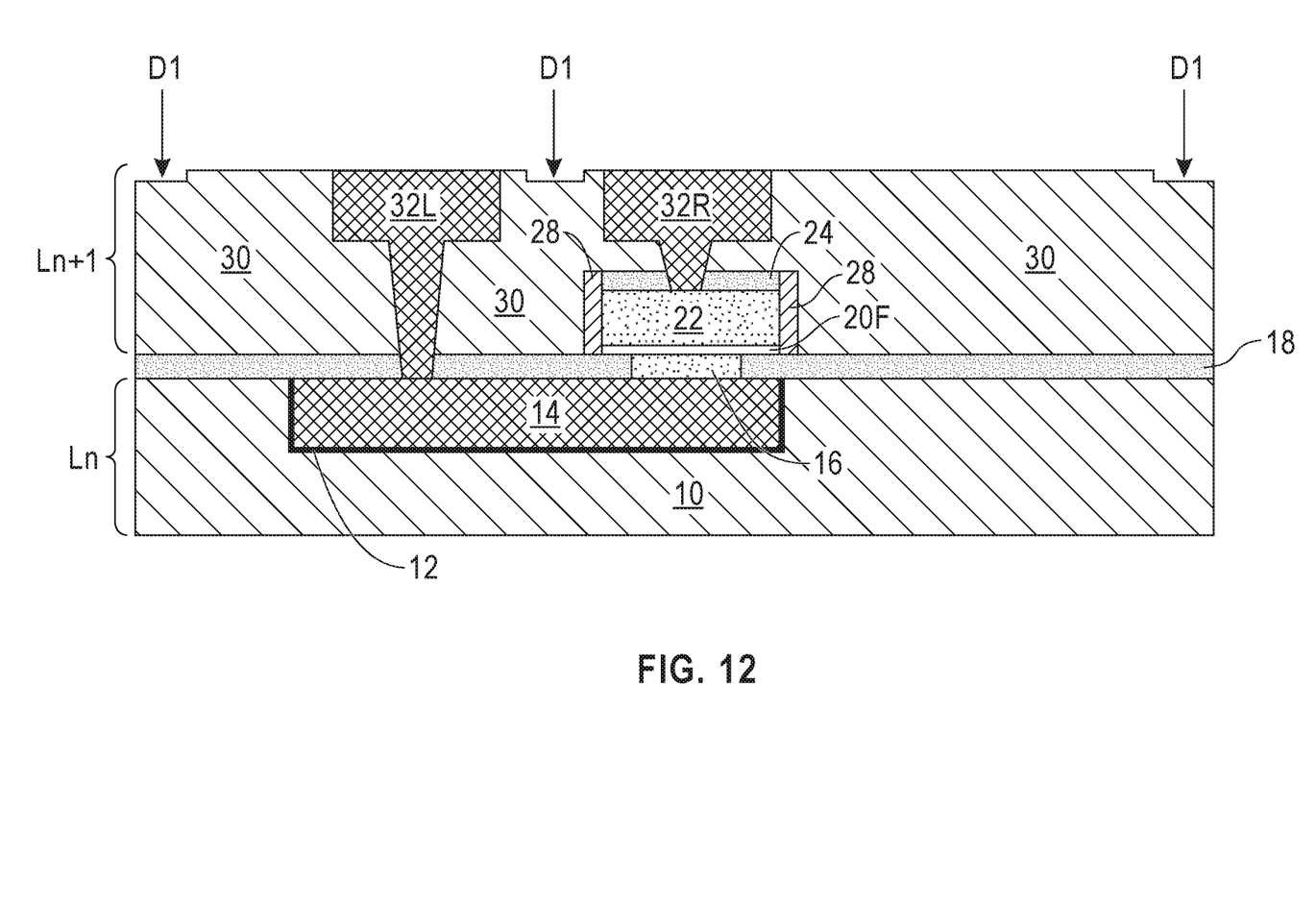
FIG. 12 is a cross sectional view of the BEOL structure FIG. 11 after removing the pair of sacrificial conductive pads.

Referring now to FIG. 12, there is illustrated the BEOL structure FIG. 11 after removing the pair of sacrificial conductive pads (34L, 34R). The pair of sacrificial conductive pads (34L, 34R) can be removed utilizing a material removal process that is selective in removing the conductive metal-containing material that provides each sacrificial conductive pad (34L, 34R). The material removal process that can be employed to remove the sacrificial conductive pads (34L, 34R) includes chemical mechanical polishing (CMP), reactive ion etching (RIE), or RIE in combination with an intermediate wet etch process. It is noted that divots, D1, remain in the second interconnect dielectric material layer 30 after the removal of the pair of sacrificial conductive pads (34L, 34R).

Notably, FIG. 12 illustrates a NVM device of the present application that includes a first electrically conductive structure 14 embedded in a first interconnect dielectric material layer 10. A resistive random access memory (ReRAM) device (16/20F/22) is located on the first electrically conductive structure 14, wherein the ReRAM device (16/20F/22) includes a bottom electrode 16, a conductive filament 20F composed of a dielectric switching material, and a top electrode 22. A second interconnect dielectric material layer 30 is located on the first interconnect dielectric material layer 10 and embeds the ReRAM device (16/20F/22). In accordance with the present application, the second interconnect dielectric material layer 30 contains an undulating upper surface having divots, D1, present therein. A pair of second electrically conductive structures (32L, 32R) is present in the second interconnect dielectric material layer 30, wherein one of the second electrically conductive structures (i.e., electrically conductive structure 32L) of the pair of second electrically conductive structures (32L, 32R) contacts a surface of the first electrically conductive structure 14, and the other of the second electrically conductive structures (i.e., electrically conductive structure 34R) of the pair of second electrically conductive structures (32L, 32R) contacts a surface of the top electrode 22 of the ReRAM device (16/20F/22).

Figure 13:
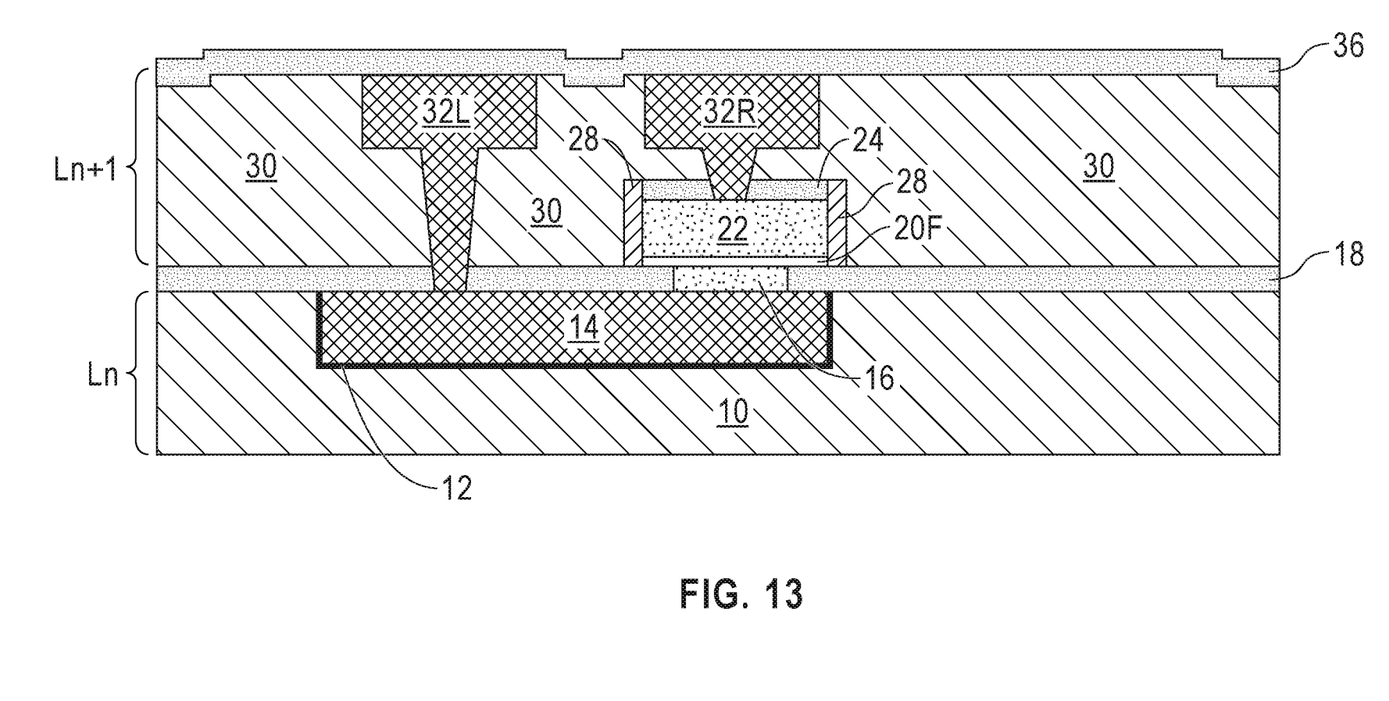
FIG. 13 is a cross sectional view of the BEOL structure of FIG. 12 after forming a dielectric capping layer.

Referring now to FIG. 13, there is illustrated the BEOL structure of FIG. 12 after forming a dielectric capping layer 36. Dielectric capping layer 36 includes one of the dielectric capping materials mentioned above for dielectric capping layer 18. In one embodiment, the dielectric capping layer 36 is composed of a compositionally same dielectric capping material as dielectric capping layer 18. In another embodiment, the dielectric capping layer 36 is composed of a compositionally different dielectric capping material than dielectric capping layer 18. The dielectric capping layer 36 may be formed utilizing one of the deposition processes mentioned above for dielectric capping layer 18. Dielectric capping layer 36 can have a thickness from 10 nm to 150 nm. Other thicknesses for the dielectric capping layer 36 are contemplated and can be used in the present application. In some embodiments, a third interconnect dielectric material layer (not shown) that provides a third interconnect level is formed above the dielectric capping layer 36. In some embodiments, the dielectric capping layer 36 is omitted.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A non-volatile memory (NVM) device comprising:
a first electrically conductive structure embedded in a first interconnect dielectric material layer, wherein the first electrically conductive structure is a continuous extending conductive structure having a first portion and a second portion;
a resistive random access memory (ReRAM) device located on the first electrically conductive structure, wherein the ReRAM device comprises a bottom electrode, a conductive filament composed of a dielectric switching material, and a top electrode, wherein the bottom electrode is in direct physical contact with the first portion of the first electrically conductive structure;
a second interconnect dielectric material layer located on the first interconnect dielectric material layer and embedding the ReRAM device, wherein an upper surface of the second interconnect dielectric material layer contains divots; and
a pair of second electrically conductive structures present in the second interconnect dielectric material layer, wherein one of the second electrically conductive structures of the pair of second electrically conductive structures is in direct physical contact with the second portion of the first electrically conductive structure, and the other of the second electrically conductive structures of the pair of second electrically conductive structures contacts a surface of the top electrode of the ReRAM device, wherein an entirety of a bottom wall of each of the divots is in contact with the second interconnect dielectric material layer and wherein at least one of the divots is located between the pair of second electrically conductive structures.

2. The NVM device of claim 1, wherein the conductive filament and the top electrode of the ReRAM device have a width that is greater than, or equal to, a width of the bottom electrode of the ReRAM device.

3. The NVM device of claim 1, wherein the bottom electrode of the ReRAM device is embedded in a dielectric capping layer that is located between the first interconnect dielectric material layer and the second interconnect dielectric material layer.

4. The NVM device of claim 1, further comprising a dielectric hard mask located on the top electrode.

5. The NVM device of claim 4, wherein the dielectric hard mask has a sidewall that is vertically aligned to a sidewall of both the top electrode and the conductive filament.

6. The NVM device of claim 1, wherein the dielectric switching material is composed of a dielectric metal oxide.

7. The NVM device of claim 1, further comprising a dielectric capping layer located on the second interconnect dielectric material layer and lining an entirety of each of the divots.

8. The NVM device of claim 1, further comprising a dielectric spacer located on a sidewall of the conductive filament and the top electrode of the ReRAM device.

9. The NVM device of claim 1, wherein the conductive filament is pre-formed using a voltage of less than 2 volts.

10. The NVM device of claim 1, wherein the conductive filament and the top electrode of the ReRAM device have a cylindrical shape.

11. A method of forming a non-volatile memory (NVM) device, the method comprising:
forming a bottom electrode on a surface of a first electrically conductive structure that is embedded in a first interconnect dielectric material layer;
forming a patterned material stack comprising, from bottom to top, a dielectric switching material and a top electrode on the bottom electrode;
forming a second interconnect dielectric material layer above the first interconnect dielectric material layer, wherein the patterned material stack is embedded in the second interconnect dielectric material layer;
forming a pair of second electrically conductive structures in the second interconnect dielectric material layer, wherein one of the second electrically conductive structures of the pair of second electrically conductive structures contacts a surface of the first electrically conductive structure, and the other of the second electrically conductive structures of the pair of second electrically conductive structures contacts a surface of the top electrode of the patterned material stack;
forming a pair of sacrificial conductive pads on the second interconnect dielectric material layer, wherein one of the sacrificial conductive pads of the pair of sacrificial conductive pads has a first area and contacts a surface of the second electrically conductive structure of the pair of second electrically conductive structures that contacts the surface of the first electrically conductive structure, and the other of the sacrificial conductive pads of the pair of sacrificial conductive pads has a second area that is different from the first area and contacts a surface of the second electrically conductive structure of the pair of second electrically conductive structures that contacts the surface of the top electrode of the patterned material stack;
performing a plasma treatment to induce an antenna effect and to convert the dielectric switching material into a conductive filament of a ReRAM device that further includes the bottom electrode and the top electrode; and
removing the pair of sacrificial conductive pads from the second interconnect dielectric material layer.

12. The method of claim 11, wherein during the forming of the pair of conductive pads on the second interconnect dielectric material layer divots are formed into the second interconnect dielectric material layer.

13. The method of claim 11, wherein the converting of the dielectric switching material into the conductive filament is performed at a voltage of less than 2 volts.

14. The method of claim 12, further comprising forming, after the removing of the pair of sacrificial conductive pads, a dielectric capping layer on an upper surface of the second interconnect dielectric material layer, wherein the dielectric capping layer is present in the divots that are present in the second interconnect dielectric material layer.

15. The method of claim 11, wherein the forming of the bottom electrode comprises embedding the bottom electrode in a dielectric capping layer that is formed on the first interconnect dielectric material layer.

16. The method of claim 11, wherein the patterned material stack further comprises a dielectric hard mask located on the top electrode.

17. The method of claim 16, wherein the dielectric hard mask has a sidewall that is vertically aligned to a sidewall of both the top electrode and the dielectric switching material.

18. The method of claim 11, wherein the dielectric switching material is composed of a dielectric metal oxide.

19. The method of claim 11, wherein the patterned material stack has a width that is greater than, or equal to, a width of the bottom electrode.

20. The method of claim 11, further comprising forming, prior to the forming of the second interconnect dielectric material layer, a dielectric spacer on a sidewall of the patterned material stack.

* * * * *